(12) United States Patent
Barowski et al.

(10) Patent No.: US 8,805,132 B2
(45) Date of Patent: Aug. 12, 2014

(54) INTEGRATED CIRCUIT PACKAGE CONNECTED TO A DATA TRANSMISSION MEDIUM

(75) Inventors: Harry Barowski, Boeblingen (DE); Thomas Brunschwiler, Rueschlikon (CH); Roger F. Dangel, Rueschlikon (CH); Hubert Harrer, Boeblingen (DE); Andreas Huber, Boeblingen (DE); Norbert M. Meier, Rueschlikon (CH); Bruno Michel, Rueschlikon (CH); Tim Niggemeier, Boeblingen (DE); Stephan Paredes, Rueschlikon (CH); Jochen Supper, Boeblingen (DE); Jonas R. Weiss, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 13/312,327

(22) Filed: Dec. 6, 2011

(65) Prior Publication Data

US 2012/0148187 A1    Jun. 14, 2012

(30) Foreign Application Priority Data

Dec. 8, 2010    (EP) ..................................... 10194096

(51) Int. Cl.
| | | |
|---|---|---|
| *G02B 6/12* | (2006.01) | |
| *G02B 6/26* | (2006.01) | |
| *H01L 23/02* | (2006.01) | |
| *H01L 23/48* | (2006.01) | |
| *H01L 23/52* | (2006.01) | |
| *H01L 21/00* | (2006.01) | |
| *G02B 6/43* | (2006.01) | |
| *H01L 25/065* | (2006.01) | |
| *H01L 23/522* | (2006.01) | |

(52) U.S. Cl.
CPC ............... *G02B 6/43* (2013.01); *H01L 2924/14* (2013.01); *H01L 25/0657* (2013.01); *H01L 23/5226* (2013.01); *H01L 2924/1533* (2013.01)
USPC ............... 385/14; 385/15; 438/106; 257/686; 257/774; 257/777

(58) Field of Classification Search
CPC ............ H01L 25/0657; H01L 23/5226; H01L 2924/14; H01L 2924/1533; G02B 6/12; G02B 6/12002; G02B 6/13; G02B 6/43
USPC ....................... 385/14, 15, 129; 438/106, 107; 257/686, 774, 777, E21.598
See application file for complete search history.

(56) References Cited

U.S. PATENT DOCUMENTS 5,204,925 A * 4/1993 Bonanni et al. ................. 385/89
6,014,313 A * 1/2000 Hesselbom .................... 361/704

(Continued)

OTHER PUBLICATIONS

3D-Plus, [online]; [retrieved on Jul. 13, 2011]; retrieved from the Internet http://www.3d-plus.com/techno-wafer-level-stack-wdod.php 3D-Plus, Reliable Miniaturization Technologies for Electronics, "Wafer Level Stack—WDoD," 2009.

(Continued)

*Primary Examiner* — Charlie Peng
*Assistant Examiner* — Hung Lam
(74) *Attorney, Agent, or Firm* — Cantor Colburn LLP

(57) ABSTRACT

An integrated circuit coupling device includes an integrated circuit package with N integrated circuit layers ($L_1$-$L_N$) arranged as a 3D stack; and a data transmission medium with n data transmission layers ($l_1$-$l_n$), wherein n≥1 and N≥2, and wherein the N integrated circuit layers are electrically connectable to the n data transmission layers.

14 Claims, 2 Drawing Sheets

(56) References Cited

U.S. PATENT DOCUMENTS

| | | | |
|---|---|---|---|
| 6,229,942 B1* | 5/2001 | Engberg et al. | 385/39 |
| 2007/0278660 A1* | 12/2007 | Han et al. | 257/698 |
| 2009/0103855 A1 | 4/2009 | Binkert et al. | |
| 2009/0251862 A1* | 10/2009 | Knickerbocker et al. | 361/699 |
| 2010/0219503 A1* | 9/2010 | Trezza | 257/532 |
| 2011/0084385 A1* | 4/2011 | Itaya et al. | 257/737 |

OTHER PUBLICATIONS

Calvin R. King, Jr. et al., "3D Stacking of Chips with Electrical and Microfluidic I/O Interconnects," Electronic Components and Technology Conference; IEEE; pp. 1-7; 2008.

Keith D. Gann, "Neo-Stacking Technology," Irvine Sensors Corporation; Published in Issue of HDI Magazine, 1999.

Irvine Sensors Inc., [online]; [retrieved on Jul. 13, 2011]; retrieved from the Internet, http://www.irvine-sensors.com/chip_stack.html Irvine Sensors Corporation, "High Density Electronic Solutions,"2000.

Philip Jacob et al., "Predicting the Performance of a 3D Processor-Memory Chip Stack," IEEE Design and Test of Computers; 3D Integration; pp. 540-547; 2005.

Vertical Circuits, [online]; [retrieved on Jul. 13, 2011]; retrieved from the Internet http://www.verticalcircuits.com/technology-core.php. Vertical Circuits Inc.; Core Technologies; 2007.

* cited by examiner

INTEGRATED CIRCUIT PACKAGE CONNECTED TO A DATA TRANSMISSION MEDIUM

PRIORITY

This application claims priority to European Patent Application No. 10194096.3, filed 8 Dec. 2010, and all the benefits accruing therefrom under 35 U.S.C. §119, the contents of which in its entirety are herein incorporated by reference.

BACKGROUND

The invention relates to the field of connection of data transmission medium to integrated circuit packages.

Increasing the integration density in planar integrated circuits (ICs) leads to a reduction of feature sizes and denser packing of devices. While transistor switching speed benefits from this evolution, the delay time due to on-chip wiring increases markedly and limits along with inter-chip wiring the overall performance of ICs and systems.

3D packaging methods are known (e.g., package-on-package (PoP)) which account for space savings by stacking separate chips into a single package. With such methods, however, chips have to communicate via off-chip signaling. In contrast, a true vertically integrated chip stack is composed of multiple dies wherein die components communicate with on-chip signaling, horizontally and with through-silicon-vias vertically. Thus, 3D integration of ICs significantly reduces the wiring length by providing vertical pathways for signal (and power) transmission. 3D integration allows large numbers of vertical vias between the layers. This allows for construction of wide bandwidth buses between functional blocks in different layers with comparably low power consumption. A typical example is a processor+memory 3D stack, with the cache memory stacked on top of the processor. Such an arrangement provides massive bandwidth improvement, see e.g., "Predicting the Performance of a 3D Processor-Memory Chip Stack" Jacob, P. et al. Design & Test of Computers, IEEE Volume 22, Issue 6, November-December 2005 Page(s): 540-547. In addition, the stacking approach is highly modular and enables the integration of dissimilar technologies in a single cube.

To exploit the full potential of today and future high-performance CPUs (stacks), the total input/output (hereafter IO) bandwidth may have to scale to more than 10 Terabits per second (Tbps) per chip (stack). At the same time the number of off-chip electrical connections (e.g. solder balls) available per die is only slowly increasing. Accordingly, power and signal delivery to single IC dies is already constrained. The number of electrical connections at the stack bottom is invariant with the stacking of high performance IC dies, hence the number of connections used for power delivery is increasing and constraining the signal connections even further.

BRIEF SUMMARY

According to a first aspect thereof, the present invention embodiments provide an integrated circuit coupling device comprising: an integrated circuit package with N integrated circuit layers arranged as a 3D stack; and a data transmission medium with n data transmission layers, wherein n≥1 and N≥2, and wherein the N integrated circuit layers are electrically connectable to the n data transmission layers.

In embodiments, the integrated circuit coupling device may include a first integrated circuit layer and a second integrated circuit layer electrically connectable to a first data transmission layer and a second data transmission layer, respectively. The integrated circuit layers are electrically connectable to the data transmission layers via electrical contacts at edges of the layers, the edges perpendicular to a stacking direction of the 3D stack The integrated circuit package may include a back-end-of-line interconnect structure or BEOL interconnect structure, with the electrical contacts connected to the BEOL interconnect structure. The electrical contacts are connected to exposed through-silicon vias, and include a material deposited by a metallization process. The data transmission medium is configured such that a first integrated circuit layer electrically connects to a second integrated circuit layer, with the data transmission medium including an optical cable having converter elements configured to convert the electrical signal into and optical signal and/or convert the optical signal into an electrical signal; and optical data transmission channels coupled to the converter elements, by buttcoupling. The data transmission medium is a flexible optical cable with a pluggable connector at one end thereof. The integrated circuit coupling device further includes an intermediate structure such as driver and/or receiver circuits, or a suitable interposer structure, the data transmission medium being connectable to the integrated circuit package via the intermediate structure.

According to another aspect, the invention is embodied as a method of fabrication of an integrated circuit coupling device, comprising steps of providing at least a first integrated circuit layer and a second integrated circuit layer adapted for being arranged as a 3D stack in an integrated circuit package and processing electrical contacts at ends of the first integrated circuit layer and the second integrated circuit layer to enable electrical connection of the first integrated circuit layer and the second integrated circuit layer to one or more data transmission layers of a data transmission medium. Preferably, the step of providing comprises providing each of the first integrated circuit layer and second integrated circuit layer with through-silicon vias or TSVs arranged therein; and the step of processing comprises: exposing said TSVs and thereby obtain electrical contacts to enable electrical connection of the first integrated circuit layer and the second integrated circuit layer to the one or more data transmission layers of a data transmission medium, respectively. Also, the step of processing may, preferably, further comprise metallizing said electrical elements.

According to another aspect, the invention is embodied as a computer system, comprising an integrated circuit coupling device according to the invention. The computer system is preferably a datacenter.

Methods and devices embodying the present invention will now be described, by way of non-limiting examples, and in reference to the accompanying drawings.

DETAILED DESCRIPTION

As an introduction to the following description, it is first pointed at a general aspect of the invention, directed to an integrated circuit (IC) coupling device. The device first comprises an IC package or stack, wherein IC layers are arranged as a 3D stack. The IC package is electrically connectable to a data transmission (or DT) medium, having one or more layers of DT channels (e.g., a multilayer optical cable). Basically, components of the device are configured such that IC layers of the package can be connected to one or more DT layers of the transmission medium. High-speed IO can be achieved through (at least one) edge(s) of the chip-stack. Such a solution can be applied to various types of 3D IC packages, ranging from a mere 3D packaging (with off-chip signaling only) to a 3D IC (with additional vertical, on-chip signaling). Thus, unless otherwise specified, the term "IC package" is intended to cover both a mere 3D packaging and a vertically integrated 3D stacks. In addition, using optics, the signals can be routed over much longer distances than comparable electrical signals, i.e., at data rates of more than 20 Gigabits per second (Gbps). The "traditional" signal path from the board to the chip can furthermore accommodate more power, ground and low speed signals, compared to known solutions.

Figure 1:
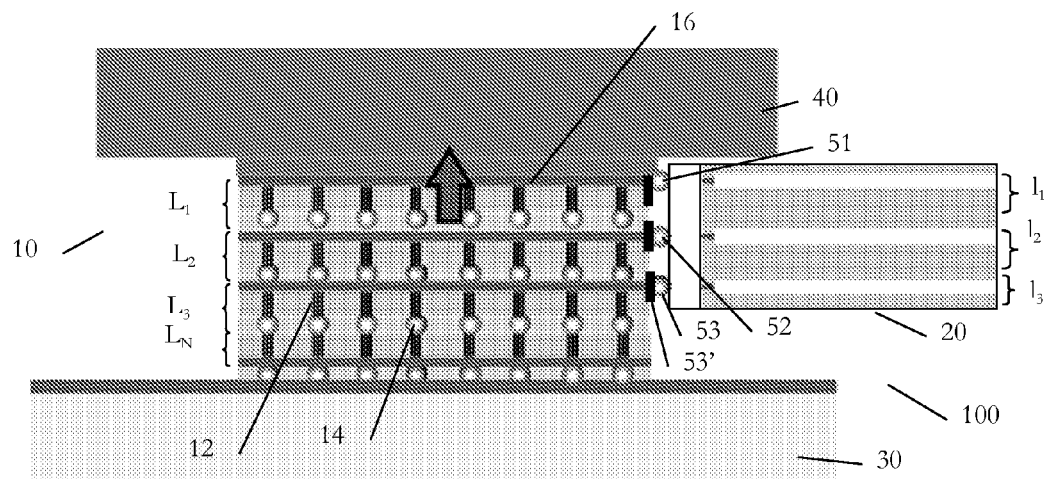
FIG. 1 schematically illustrates an IC coupling device comprising an IC package and a multilayer data transmission medium, according to embodiments of the invention.

In more details, in reference to FIG. 1, an IC coupling device 100 is schematically represented. First, an IC package 10 is provided which comprises several IC layers $L_1$-$L_N$ arranged as a 3D stack.

The IC package likely features Through Silicon Vias (TSVs) 12, solder balls 14, provided on each of the layers, amongst other usual features. Numeral reference 16 denotes (symbolically) the back-end-of line (BEOL) interconnect structure, while 40 denotes any convenient heat-sink infrastructure. Heat is transferred and absorbed as depicted by the arrow. Obviously, some details are omitted, for clarity. The package may for instance be arranged as a processor+ memory 3D stack, with the cache memory stacked on top of the processor or vice versa.

The device 100 also comprises a DT medium 20, comprising one or more DT layers $l_1$-$l_n$, which comprise one or several DT channels. As evoked earlier, IC layers of the package 10 can be connected to one or more DT layers of the DT medium 20, i.e., n≥1, N≥2 and n needs not to be equal to N. Connection occurs typically from a layer edge, i.e., perpendicularly to a stacking direction, giving rise to many possible connection schemes. In particular, no layer-by-layer assignment is required, i.e., multiple layers, or even, multiple channels from one layer of the IC stack can be assigned to a single channel in the DT medium. A layer-by-layer connectivity is not required inasmuch as rearrangement or time multiplexing is possible.

Preferably yet, at least two IC layers $L_1$, $L_2$ are respectively connectable to two DT layers $l_1$, $l_2$. Incidentally, specific multilayer DT medium could be designed such as to match dimensions of a given chip stack, and reciprocally. Yet, dimensional constraints may require having n<N. Other constraints (e.g., ergonomy of the coupling device) may induce additional constrains on n vs. N.

Such structures open new horizons in terms of IO, compared with solutions wherein connections are made e.g., from the "top" of the package 10.

The DT medium 20 preferably is an optical cable, e.g., a flexible cable. The very small electrical path-length between the processor and the optical components allows for extremely high data-rates in that case. Namely, 40 Gbps or more per channel can be contemplated. A 3D chip stack with drivers on multiple levels allows for fully exploiting the high channel density of optics, which typically is very difficult when board-level, planar wiring strategies must be used to provide n×m arrays of optical elements with the required signals. The tight mechanical connection of the active components of the cable with the chip-stack allows for reusing the existing heat-sink infrastructure, if any, or additional, for the optical components.

In embodiments, each layer of optical components is connected to only one of the layers of the chip-stack. This is however not required. For example, individual layers may connect with a transceiver element directly.

In other embodiments, the data transmission medium can be configured such that a given, first IC layer $L_1$ connects to a second IC layer $L_2$. For example, two end DT layers can join to form a same optical circuit (not shown), which connects to different chip-dies within the stack, thus allowing for decreasing through-die-connections while preserving an efficient routing of IOs. Accordingly, one understands that the present invention can accommodate various degree of on-chip vs. off-chip signaling.

Figure 2:
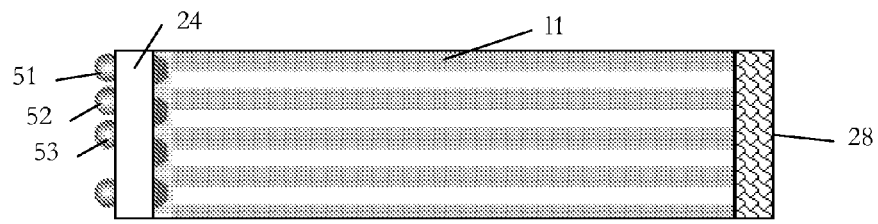
FIG. 2 focuses on a specific multilayer data transmission medium, as involved in embodiments.

FIG. 2 focuses on the DT medium 20, as involved in embodiments. Here, the DT medium is a flexible optical cable, which comprises electro-optical and/or opto-electrical conversion circuits 24 (e.g. VCSE Lasers and Photo-diodes), that directly couple into optical waveguides or fibers and thus have low coupling losses. More generally, the optical DT channels can be coupled to any element suitable for converting electrical signal into optical signal, and reciprocally.

A method used for coupling the electro-optical element to the waveguides/fibers is preferably the so-called butt-coupling method, which is simple to implement and does not require extra components. However, other coupling schemes, such as using lenses, mirrors and other optical elements can also be contemplated.

On the other extremity, the active optical cable may be terminated with an optical connector device 28, preferably pluggable into another structure. The optical cable (or more generally the DT medium) may also connect two IC stacks.

Typically, the cable 20 uses (CMOS) drivers and receivers on the dies of the chip-stack or external converters on the flex circuit itself.

Figure 4:
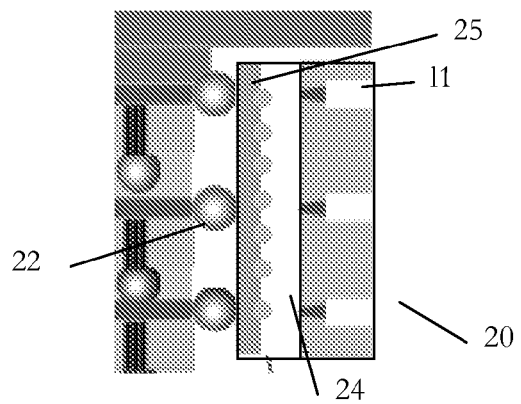
FIG. 4 emphasizes an intermediate coupling chip, connecting an IC package to a transmission medium, as involved in embodiments.

Should the technology of the stacked chips not be suitable to build driver and receiver circuits (e.g. because of supply voltage limitations), then a suitable driver/receiver chip 25 can be attached "behind" the electro-optical chip 24 and through its backside be connected to the chip-stack instead of the electro-optical component, as depicted in FIG. 4. More generally, the DT medium can be connected to the IC package via such driver and/or receiver circuits 25, or any intermediate structure (e.g., any suitable interposer). For instance, an Si interposer could be used for the multilayer data transmission medium as well as for the chip stack—the Si-carrier is not a IC component, since it only consists of interconnects and passives.

Referring back to FIG. 1, typically, the layers are electrically connectable via electrical contacts 51-53 arranged at edges of the layers, as depicted (i.e., the layer edges perpendicular to the stacking direction). In this respect, suitable electrical contacts 51-53 may be provided at the package 10 and/or at the DT medium 20, as seen in FIG. 2.

Electrical contact elements are however preferably provided on both sides. In that case, electrical contacts on one side are arranged such that they can directly interface with electrical contacts formed on the other side. Such a connection scheme has the additional advantage that thickness-tolerances in the stack can easily be absorbed by the electrical contacts, while the distances at stake (e.g., 10's of microns) would already pose serious issues for direct optical coupling schemes.

For simplicity, the electrical connections between the active optical cable and the chip-stack are connected to the back-end-of-the-line (BEOL) interconnect structure 16 of the stacked chips.

Increasing the contact area of the chip-stack might be necessary in some cases, e.g. by depositing extra contact material 53' to the edge of the chip-stack. For this purpose different processes such as sputtering, evaporation, electroless plating, etc. with or without structuring (e.g. by shadow-masks, by photo-lithography or direct laser writing), can be employed. More generally, the electrical contacts 51-53 may comprise extra contact material deposited by any convenient metallization process.

In embodiments, the active cable is permanently attached, e.g. by means of flip-chip bonding, suitable soldering processes and the like.

Technologies as the one by "Irvine Sensors" (Neo-Wafer-Stacking, see http://www.irvine-sensors.com/chip_stack.html) could advantageously be relied upon, for preparing the main-chip-stack for attaching electro-optical components to its edge as described in this document, see e.g.: http://www.irvine-sensors.com/pdf/Neo-Stacking%20Technology%20HDI-3.pdf, as retrieved from the Internet on Nov. 24, 2010. Another, comparable process that can be used is the so-called WDoD process from 3DPlus at http://www.3d-plus.com/techno-wafer-level-stack-wdod.pbp, as accessed on Nov. 24, 2010.

Briefly, the preparation process may decompose as:
1. Known good chip dies are reassembled to form "clusters" of heterogeneous superchips;
2. ≥2 metallization layers are added to interconnect between the chip-dies and route bus-signals to the edge of the superchip, i.e., to the streets or scribelines;
3. The superchips are diced and laminated to stacks;
4. The stacks are lapped/polished on two sides to expose the bus signals of each layer; and
5. The latter two stack sides are metallized and patterned, such that the bus-signals are interconnected between the stack-layers and up to a ceramic top-lid which is used for stack/module-level interconnections, bumping or wire-bonding.

While edge metallization is usually carried out to interconnect individual layers, in this invention this task is preferably fulfilled by means of TSVs, which are exposed during e.g., a dicing, lapping or polishing step. Metallization (and signals) at the edge of the stack can, in the context of the present invention, be used to attach optical I/O circuits without requiring extra metallization steps.

For the purpose of realizing devices according to the present invention, either the Neo-stacking could be complemented such as described above or, more likely, edge-lapping, metallization and patterning processes as used for the Neo-stacking could be used to complement other state-of-the-art die-stacking and packaging technologies.

Similar but more recent approaches which make even more use of wafer-level-processing are described in:
3d-plus, http://www.3d-plus.com/techno-wafer-level-stack-wdod.php; and
Vertical Circuits Inc., see https://www.verticalcircuits.com/technology-core.php (as of Nov. 24, 2010).

Figure 3:
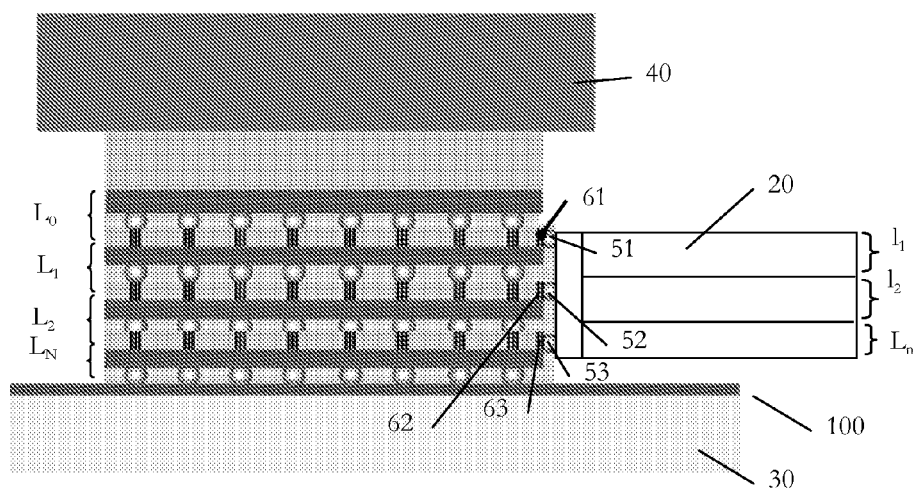
FIG. 3 illustrates an IC coupling device, wherein an IC stack is diced at the level of TSVs, serving as electrical contact pads, according to embodiments of the invention.

Next, in reference to FIG. 3, the electrical contacts 51-53 are advantageously connected to diced through-silicon vias 61-63, serving as electrical pads, suitably located at the chip edge to electrically connect to the DT medium 20.

Realizing that electrical contacts (i.e., to connect to the DT medium) can advantageously be connected to the BEOL wiring, a practical solution therefore is to make use of existing building-blocks. For instance, TSVs can be fabricated up to 100 μm deep into silicon and connected to the global BEOL wires. Modified pad TSVs can thus be fabricated at the edge of the chip, e.g., simultaneously with the standard TSVs. To that aim, "half" of the pad TSV (or any convenient fraction) can be located in the kerf (dicing zone) area.

Note that dicing could also be preformed just next to the TSVs, and a later dry or wet etching process could expose them.

Hence, the pad TSV becomes exposed after dicing and can be used as pad for the later soldering. Typical TSV materials are: copper, tungsten and poly-silicon.

Additionally electroless nickel plating could be used to form the under bump metallization.

As the skilled person may appreciate, the embodiment of FIG. 4 can accommodate a number of features already described in reference to FIG. 1, 2 or 4. In fact, the embodiment of FIG. 4 can be regarded as relying on diced, edge TSVs 61-63, instead of additional contact material 53' in FIG. 1.

Figure 5:
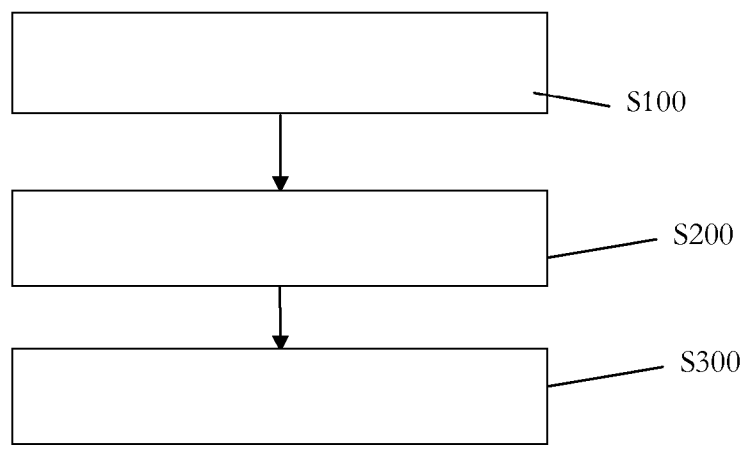
FIG. 5 is a flowchart reflecting general steps of a method of fabrication of an IC coupling device, according to embodiments.

FIG. 5 shows a flow chart of high-level steps of methods of fabrication of IC coupling device 100, in embodiments. Step S100: an IC package 10 such as described above is provided, yet at an early stage of fabrication; Step S200: electrical contacts are processed at edge(s) of IC layers to later allow for connecting to respective DT layers of a multilayer DT medium as described above. Extra contact material is provided, if necessary; or modified pad TSVs are processed, e.g., simultaneously with the standard TSVs, at an edge of the chip, as described in reference to FIG. 3. Note, however, that the apparent order of steps as described above is not at all mandatory, inasmuch as exposing the TSVs may be carried out before step S100 (e.g., in case of die-to-die bonding) or between S100 and S200 (e.g., in case of wafer-to-wafer bonding). This, of course, depends on the actual manufacturing process chosen. S300: additional metallization steps can be carried out, if needed, such as electroless nickel plating to form the under bump metallization, as evoked in reference to FIG. 3.

To conclude, this invention can advantageously be applied to IC coupling devices equipped with 3D chip stacks, as described herein, processors and computers (e.g., datacenter) equipped with such IC coupling devices. A computer using such devices may require slightly modified computer program code to run such devices, notably at the operating system level. Such computer program code may be implemented, if needed, in a high-level (e.g., procedural or object-oriented) programming language, or in assembly or machine language if desired; and in any case, the language may be a compiled or interpreted language.

Thus and more generally, parts of the invention may be implemented in digital electronic circuitry, or in computer hardware, firmware, software, or in combinations of them. Generally, processors will receive instructions and data from a read-only memory and/or a random access memory, possibly arranged as evoked earlier in introduction.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims. For example, other materials than those evoked above may be convenient.

What is claimed is:

1. An integrated circuit coupling device comprising:
an integrated circuit package with N integrated circuit layers ($L_1$-$L_N$) arranged as a 3D stack, wherein each N integrated circuit layer is formed in a diced chip, with each chip being laminated so as to form the 3D stack, and wherein the stack is polished at both sides to expose bus signals of each layer; and
a data transmission medium with n data transmission layers ($l_1$-$l_n$), wherein n≥1 and N≥2,
and wherein the N integrated circuit layers are electrically connectable to the n data transmission layers via electrical contacts at edges of the layers, the edges being perpendicular to a stacking direction of the 3D stack.

2. The integrated circuit coupling device of claim 1, wherein a first integrated circuit layer ($L_1$) and a second integrated circuit layer ($L_2$) are electrically connectable to a first data transmission layer ($l_1$) and a second data transmission layer ($l_2$), respectively.

3. The integrated circuit coupling device of claim 1, wherein:
the integrated circuit package comprises a back-end-of-line interconnect structure or BEOL interconnect structure; and
the electrical contacts are connected to the BEOL interconnect structure.

4. The integrated circuit coupling device of claim 1, wherein the electrical contacts are connected to diced, exposed through-silicon vias located at the edges of the layers.

5. The integrated circuit coupling device of claim 1, wherein the electrical contacts comprise a material deposited by a metallization process.

6. The integrated circuit coupling device of claim 1, wherein the data transmission medium is configured such that a first integrated circuit layer ($L_1$) electrically connects to a second integrated circuit layer ($L_2$, $L_3$ or $L_N$).

7. The integrated circuit coupling device of claim 1, wherein the data transmission medium is an optical cable comprising:
converter elements configured to perform one or more of:
converting an electrical signal into an optical signal and convert the optical signal into the electrical signal; and
optical data transmission channels coupled to the converter elements, by butt-coupling.

8. The integrated circuit coupling device of claim 1, wherein the data transmission medium is a flexible optical cable with a pluggable connector at one end thereof.

9. The integrated circuit coupling device of claim 1, further comprising an intermediate structure including one or more of driver and receiver circuits, an interposer structure, and combinations thereof, the data transmission medium being connectable to the integrated circuit package via the intermediate structure.

10. A method of fabrication of an integrated circuit coupling device, the method comprising:
arranging at least a first integrated circuit layer and a second integrated circuit layer as a 3D stack in an integrated circuit package and processing electrical contacts at ends of the first integrated circuit layer and the second integrated circuit layer to enable electrical connection of the first integrated circuit layer and the second integrated circuit layer to one or more data transmission layers of a data transmission medium, wherein the first and second integrated circuit layers are electrically connectable to the one or more data transmission layers via electrical contacts at edges of the layers, the edges being perpendicular to a stacking direction of the 3D stack, and wherein the first integrated circuit layer and the second integrated circuit layer are each formed in a diced chip, with each chip being laminated so as to form the 3D stack, and wherein the stack is polished at both sides to expose bus signals of each layer.

11. The method of claim 10, wherein:
each of the first integrated circuit layer and second integrated circuit layer include through-silicon vias or TSVs arranged therein; and
the processing further comprises exposing and dicing one or more the TSVs located at the edges of the layers and thereby obtaining electrical contacts to enable electrical connection of the first integrated circuit layer and the second integrated circuit layer to the one or more data transmission layers of a data transmission medium, respectively.

12. The method of claim 10, wherein the processing further comprises metallizing the electrical elements.

13. A computer system, comprising an integrated circuit coupling device according to claim 1.

14. The computer system of claim 13, wherein the computer system comprises a datacenter.

* * * * *